(12) United States Patent
Wang et al.

(10) Patent No.: US 11,788,182 B2
(45) Date of Patent: Oct. 17, 2023

(54) IRRADIATION-RESISTANT AND ANTI-WEAR HYDROGEN-FREE CARBON FILM ON POLYMER SURFACE AND PREPARATION METHOD AND USE THEREOF

(71) Applicant: Lanzhou Institute of Chemical Physics, Chinese Academy of Sciences, Lanzhou City (CN)

(72) Inventors: Peng Wang, Lanzhou City (CN); Liqiang Chai, Lanzhou City (CN); Li Qiao, Lanzhou City (CN); Xiaogang Bai, Lanzhou City (CN); Xiaoyu Zhao, Lanzhou City (CN)

(73) Assignee: Lanzhou Institute of Chemical Physics Chinese Academy of Sciences, Lanzhou (CN)

( * ) Notice: Subject to any disclaimer, the term of this patent is extended or adjusted under 35 U.S.C. 154(b) by 17 days.

(21) Appl. No.: 17/580,900

(22) Filed: Jan. 21, 2022

(65) Prior Publication Data

US 2023/0052627 A1     Feb. 16, 2023

(30) Foreign Application Priority Data

Aug. 10, 2021  (CN) .......................... 202110911723.7

(51) Int. Cl.
| | |
|---|---|
| *C23C 14/06* | (2006.01) |
| *C23C 14/02* | (2006.01) |
| *C23C 14/34* | (2006.01) |
| *C23C 14/35* | (2006.01) |
| *C23C 14/50* | (2006.01) |
| *C23C 14/54* | (2006.01) |
| *H01J 37/34* | (2006.01) |

(52) U.S. Cl.
CPC .......... *C23C 14/0605* (2013.01); *C23C 14/022* (2013.01); *C23C 14/3407* (2013.01); *C23C 14/35* (2013.01); *C23C 14/505* (2013.01); *C23C 14/543* (2013.01); *H01J 37/3405* (2013.01); *H01J 37/3426* (2013.01)

(58) Field of Classification Search
CPC ............... C23C 14/0605; C23C 14/022; C23C 14/3407; C23C 14/35; C23C 14/505; C23C 14/543; H01J 37/3405; H01J 37/3426; C23C 14/02; C23C 14/021
See application file for complete search history.

(56) References Cited

U.S. PATENT DOCUMENTS

| | | | | |
|---|---|---|---|---|
| 5,830,331 | A | * 11/1998 | Kim et al. ............... | G11B 5/84 204/192.15 |
| 2004/0234796 | A1* | 11/2004 | Sato .................. | G11B 5/70621 |
| 2008/0089922 | A1* | 4/2008 | Cheng et al. .......... | A61L 27/18 424/426 |

(Continued)

FOREIGN PATENT DOCUMENTS

CN           108707863  B  *  1/2020 ............... C23C 14/021

OTHER PUBLICATIONS

CN-108707863-B Translation (Year: 2020).*

*Primary Examiner* — Jennifer Wecker
*Assistant Examiner* — Patrick S Ott
(74) *Attorney, Agent, or Firm* — Dorsey & Whitney LLP

(57) ABSTRACT

A hydrogen-free carbon film polymer lubricating material and a preparation method and use thereof are disclosed. In the method, a graphite target is used as the target material, and a magnetron sputtering deposition is performed on a surface of the polymer substrate, thereby physically depositing and forming a hydrogen-free carbon film on the surface of the polymer substrate, thereby obtaining a hydrogen-free carbon film polymer lubricating material.

4 Claims, 3 Drawing Sheets

(56) References Cited

U.S. PATENT DOCUMENTS

2013/0121892 A1* 5/2013 Fuhrmann et al. ...... C08J 7/056
                                                          156/60
2018/0023187 A1* 1/2018 Binder et al. ........ C23C 28/046
                                                          428/332
2022/0275503 A1* 9/2022 Arnoult ................ D06M 10/06

* cited by examiner

IRRADIATION-RESISTANT AND ANTI-WEAR HYDROGEN-FREE CARBON FILM ON POLYMER SURFACE AND PREPARATION METHOD AND USE THEREOF

CROSS REFERENCE TO RELATED APPLICATION

This application claims priority to Chinese Patent Application No. 202110911723.7, entitled "hydrogen-free carbon film polymer lubricating material and preparation method and use thereof" filed with the China National Intellectual Property Administration on Aug. 10, 2021, which is incorporated herein by reference in its entirety.

TECHNICAL FIELD

The present disclosure relates to the technical field of solid lubricating materials, in particular to a hydrogen-free carbon film polymer lubricating material and a preparation method and use thereof.

BACKGROUND

Polymer lubricating materials, exhibiting excellent friction performance, good mechanical performance, and corrosion resistance, are especially suitable for the preparation of oil-free friction pairs and dynamic sealing parts under special working conditions. However, some polymer lubricating materials have the problem of low friction coefficient but high wear rate, while another polymer lubricating materials have the problem of low wear rate but high friction coefficient. Therefore, it is necessary to comprehensively control the friction performance of polymer lubricating materials by means of surface modification to make them meet the service conditions under specific conditions.

Nuclear energy is proved to be a stably obtainable clean energy that provides a large amount of electricity in the form of base load. Nuclear power plant is an important aspect of nuclear energy utilization, which has attracted the attention of countries all over the world. In the process of safe utilization of nuclear energy, sealing and lubricating materials will inevitably be used to realize the smooth operation of nuclear devices. However, due to the particularity of nuclear energy release, its energy release is accompanied by high-energy particles (α, β, γ and neutron) irradiation, where γ particles and neutrons have high penetrability, and they irradiate all the devices in the nuclear island. After γ irradiation, the surface of polymer lubricating materials suffer from oxidation and degradation to varying degrees, which destroys its surface structure and affects its friction and lubrication characteristics.

Carbon-based films have advantages of excellent friction reduction and wear resistance, good mechanical performance and chemical stability. In recent years, some researchers have deposited hydrogen-containing carbon films on the surface of polymers to improve the lubrication, wear resistance, antibacterial and oxidation resistance of polymers. However, the existing polymer lubricating materials still have the problem of poor radiation resistance.

SUMMARY

An object of the present disclosure is to provide a hydrogen-free carbon film polymer lubricating material and a preparation method and use thereof. The hydrogen-free carbon film polymer lubricating material has excellent radiation resistance and excellent comprehensive friction performance.

In order to achieve the above-mentioned object of the present disclosure, the present disclosure provides the following technical solutions:

Provided is a method for preparing a hydrogen-free carbon film polymer lubricating material, including using a graphite target as a sputtering target material, and performing a magnetron sputtering deposition on a polymer substrate material, to obtain the hydrogen-free carbon film polymer lubricating material.

In some embodiments, the polymer substrate material has a surface roughness Ra of not larger than 400 nm, and the polymer substrate material is selected from the group consisting of polytetrafluoroethylene (PTFE), polyether ether ketone (PEEK), and polyimide (PI).

In some embodiments, the method further comprises before performing the magnetron sputtering deposition, subjecting the polymer substrate material to a plasma cleaning, to obtain a polymer substrate material with active oxygen-containing functional groups on a deposition surface.

In some embodiments, the plasma cleaning comprises a first plasma cleaning and a second plasma cleaning performed in sequence; the first plasma cleaning is performed in an argon gas atmosphere under conditions: a flow rate of argon gas being 20-40 sccm, a pressure of the argon gas atmosphere being 5.0-8.0 Pa, a pulse bias voltage for the first plasma cleaning being -500 V, and a first cleaning time being 5 min.

In some embodiments, the second plasma cleaning is performed in a mixed atmosphere of argon gas and oxygen gas under conditions: a flow rate of the argon gas being 20-40 sccm, a flow rate of the oxygen gas being 20-40 sccm, a pulse bias voltage for the second plasma cleaning being -500 V, and a second cleaning time being 5 min.

In some embodiments, the magnetron sputtering deposition is performed under conditions: a sputtering current being 3.0-4.0 A, a gas pressure being 0.75-1 Pa, and a deposition time being 120-180 min.

In some embodiments, the magnetron sputtering deposition is performed in an argon atmosphere, and during the magnetron sputtering deposition, the polymer substrate material is rotated at a rotation rate of 5-8 r/min.

The present disclosure provides a hydrogen-free carbon film polymer lubricating material prepared by the method as described in the above technical solutions, comprising a polymer substrate material and a hydrogen-free carbon film deposited on a surface of the polymer substrate material.

In some embodiments, the hydrogen-free carbon film has a thickness of 0.7 to 1.2 μm.

The present disclosure also provides use of the hydrogen-free carbon film polymer lubricating material as described in the above technical solutions in nuclear equipment.

The present disclosure provides a method for preparing a hydrogen-free carbon film polymer lubricating material, which includes the following steps: using a graphite target as a sputtering target material, and performing a magnetron sputtering deposition on a polymer substrate material to obtain a hydrogen-free carbon film polymer lubricating material. In the method according to the present disclosure, a graphite target is used as a target material and a magnetron sputtering deposition is performed on a surface of the polymer substrate. Therefore, a hydrogen-free carbon film is physically deposited and formed on the surface of the polymer substrate, thereby forming a hydrogen-free carbon film polymer lubricating material. Since the hydrogen-free carbon film does not contain C—H bonds, there is no C—H bond rupture when exposed to an irradiated environment, and thus no $H_2$ release occurs. Therefore, the hydrogen-free carbon film itself exhibits radiation resistance, thereby improving the radiation resistance performance of the polymer lubricating material. Also, because the hydrogen-free carbon film deposited on the polymer surface isolates the direct contact between oxygen in the atmosphere and the polymer surface, it hinders the radiation oxidative degradation reaction on the polymer surface, thereby further improving the radiation resistance stability of the polymer lubricating material.

Further, the present disclosure adopts a magnetron sputtering-physical vapor deposition, and realizes the control of the deposition rate at nanometer level by adjusting parameters for the magnetron sputtering. Moreover, the plasma cleaning process allows the formation of chemical bonds between the substrate polymer and the carbon film, making the binding force larger, so that a good mechanical property match could be formed between the carbon film and the polymer substrate, thereby endowing carbon film with better wear resistance and friction reduction performance. In the present disclosure, through the magnetron sputtering-physical vapor deposition method, a hydrogen-free carbon film with micron-level thickness, good adhesion, excellent wear resistance and friction reduction performance and good radiation resistance could be deposited on the polymer surface, thereby obtaining a hydrogen-free carbon film polymer lubricating material, which greatly promotes its use in nuclear equipment. The results of the examples show that the hydrogen-free carbon film prepared on the polymer surface by the method of the present disclosure exhibits more excellent wear resistance and friction reduction performance and better radiation resistance performance compared with the polymer substrate without the film.

DETAILED DESCRIPTION OF THE EMBODIMENTS

Figure 1A:
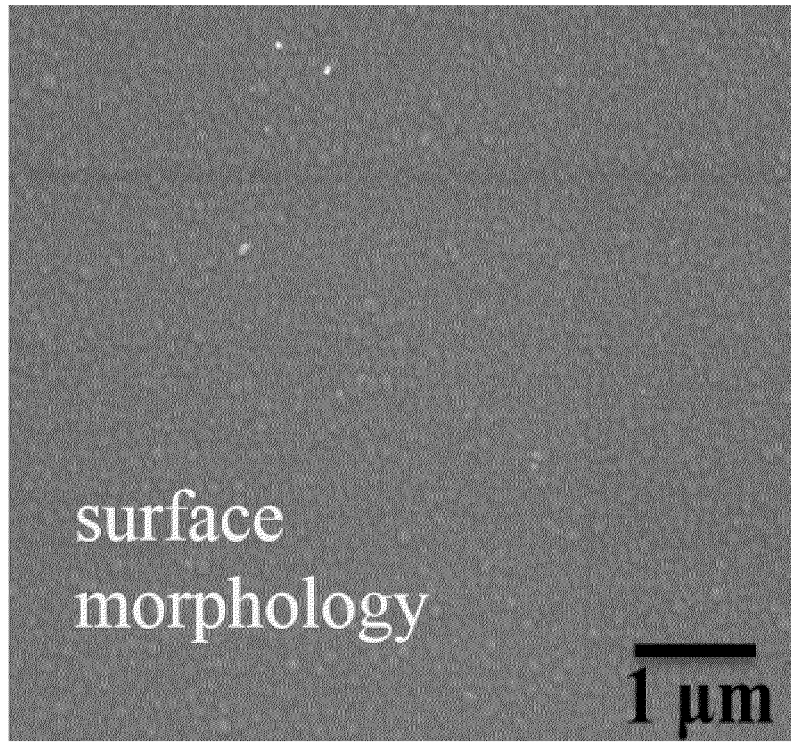
FIGS. 1A and 1B are scanning electron microscope (SEM) images of the hydrogen-free carbon film polymer lubricating material as prepared in Example 1.

The present disclosure provides a method for preparing a hydrogen-free carbon film polymer lubricating material, which includes the following steps:

using a graphite target as a sputtering target material, and performing a magnetron sputtering deposition on a polymer substrate material to obtain the hydrogen-free carbon film polymer lubricating material.

In the present disclosure, unless otherwise specified, the raw materials required for the preparation are all commercially available products well known to those skilled in the art.

In some embodiments of the present disclosure, the graphite target has a purity of 99.99 at.%, and a size of 300×75 mm.

In some embodiments of the present disclosure, the polymer substrate material has surface roughness Ra of not larger than 400 nm. In some embodiments, the polymer substrate material includes polytetrafluoroethylene, polyether ether ketone, or polyimide. In the present disclosure, there is no special limitation on the specifications of the polymer substrate material, and commercially available products well known in the art may be used. In some embodiments of the present disclosure, a surface roughness of the polymer substrate material that meets the above requirements is achieved by polishing. In the present disclosure, there is no special limitation on the polishing process, and a process well known in the art may be used to achieve the above surface roughness.

In some embodiments of the present disclosure, the magnetron sputtering deposition is carried out on the JS650 magnetron sputtering system produced by Shenyang Scientific Instruments Co., Ltd., Chinese Academy of Sciences, China. In some embodiments, the graphite target is installed on two independent target positions of the magnetron sputtering system. In some embodiments of the present disclosure, the JS650 magnetron sputtering system is equipped with an air extraction system, a vacuum chamber, a cooling system and a medium-frequency power supply. In the present disclosure, there is no special limitation on the specific structure of the JS650 magnetron sputtering system, and the JS650 magnetron sputtering system, which is well known in the art, may be used.

In some embodiments of the present disclosure, the polymer substrate material is cleaned and dried with nitrogen in sequence, and then installed on a sample stage in a vacuum chamber of the magnetron sputtering system. In some embodiments of the present disclosure, the cleaning process is performed by an ultrasonic cleaning with anhydrous ethanol and acetone in sequence, each for 8-15 minutes. In the present disclosure, there is no special limitation on the ultrasonic cleaning process, and a process well known in the art may be adopted.

After installing the polymer substrate material on the sample stage in the vacuum chamber, according to some embodiments of the present disclosure, a pumping system of the magnetron sputtering system is used, in which, a mechanical pump is used to pre-vacuum the vacuum chamber to a vacuum degree of 10 Pa (absolute pressure), and then a molecular pump is turn on to vacuum the vacuum chamber to a vacuum degree not less than $2.0 \times 10^{-3}$ Pa (absolute pressure), thereby discharging air and moisture from the vacuum chamber.

According to some embodiments of the present disclosure, after vacuuming the vacuum chamber and before performing the magnetron sputtering deposition, the polymer substrate material is subjected to a plasma cleaning, to obtain a polymer substrate material with active oxygen-containing functional groups on a deposition surface.

In some embodiments of the present disclosure, the plasma cleaning includes a first plasma cleaning and a second plasma cleaning performed in sequence. In some embodiments, the first plasma cleaning is performed in an argon gas atmosphere. In some embodiments, a flow rate of argon gas is in the range of 20-40 sccm. In some embodiments, a pressure of the argon gas atmosphere is in the range of 5.0-8.0 Pa. In some embodiments, a pulse bias for the first plasma cleaning is -500 V. In some embodiments, a first cleaning time is 5 min. In some embodiments of the present disclosure, the argon gas has a high purity. In some embodiments, the argon gas has a purity of 99.999%.

In some embodiments of the present disclosure, a high-purity argon gas is introduced into the vacuum chamber, the pressure of argon gas is adjusted through a flapper valve, and a pulse bias is applied to a sample stage to perform the first plasma cleaning. In the present disclosure, the first plasma cleaning is to remove contaminations on the surface of the polymer substrate material.

In some embodiments of the present disclosure, oxygen is introduced into the vacuum chamber to perform the second plasma cleaning. In some embodiments, the second plasma cleaning is performed in a mixed atmosphere of argon gas and oxygen gas. In some embodiments, a flow rate of argon gas is in the range of 20-40 sccm. In some embodiments, the flow rate of argon gas is the same as that of argon gas for the first plasma cleaning. In some embodiments, a flow rate of oxygen gas is in the range of 20-40 sccm. In some embodiments, a pulse bias voltage for the second plasma cleaning is -500 V. In some embodiments, a second cleaning time is 5 min. In some embodiments of the present disclosure, the oxygen gas has a high purity. In some embodiments, the oxygen gas has a purity of 99.99%. In some embodiments of the present disclosure, the pressure for the second plasma cleaning is based on the total pressure of oxygen gas and argon gas introduced. In the present disclosure, by the second plasma cleaning, an active oxygen-containing functional group is formed on the surface of the polymer substrate material, such that a chemical bond is formed between the subsequently formed carbon film and the polymer surface, thereby enhancing the bonding force and improving the wear resistance of the polymer lubricating material.

In some embodiments of the present disclosure, after completing the second plasma cleaning, the introduction of the oxygen gas is stopped and the pressure in the vacuum chamber is adjusted to 0.5-0.6 Pa.

In some embodiments of the present disclosure, after the plasma cleaning, a medium-frequency power supply is used for the sputtering of the graphite target, and the sputtering is performed at a sputtering current of 3.0 A to 4.0 A, and a pressure of 0.5 Pa to 0.6 Pa for 30 min, and then the pressure in the vacuum chamber is adjusted to 0.75-1 Pa through a flapper valve for the magnetron sputtering deposition. In the present disclosure, the bombarding is carried out under low pressure conditions, and then a magnetron sputtering deposition is carried out under higher pressure, which could improve the compactness of the film and avoid too much internal stress in the film. In some embodiments of the present disclosure, the magnetron sputtering deposition is performed at a sputtering current of 3.0-4.0 A, and a pressure of 0.75-1 Pa. In some embodiments, the magnetron sputtering deposition is performed for 120-180 min. In some embodiments, the magnetron sputtering deposition is performed in an argon gas atmosphere. In some embodiments, a flow rate of argon gas is in the range of 20-40 sccm. In some embodiments, during the magnetron sputtering deposition, a rotation rate of the polymer substrate material (sample stage) is in the range of 5-8 r/min. In some embodiments of the present disclosure, the magnetron sputtering deposition starts at room temperature, and the temperature rise during the entire deposition is less than 130° C.

In some embodiments of the present disclosure, after the magnetron sputtering deposition, the medium-frequency power supply is turn off, and the obtained product is placed in the furnace for not less than 2 hours to obtain a hydrogen-free carbon film polymer lubricating material.

The present disclosure provides a hydrogen-free carbon film polymer lubricating material prepared by the method as described in the above technical solutions, which includes a polymer substrate material and a hydrogen-free carbon film deposited on a surface of the polymer substrate material.

In some embodiments of the present disclosure, the hydrogen-free carbon film has a thickness of 0.7-1.2 μm. In some embodiments, the hydrogen-free carbon film has a strength ratio $I_D : I_G$ of (1.10-1.35) : 1.

The present disclosure provides use of the hydrogen-free carbon film polymer lubricating material as described in the above technical solutions in nuclear equipment. In the present disclosure, there is no special limitation on the method for use, and a method well known in the art may be used. In some embodiments of the present disclosure, the use of said hydrogen-free carbon film polymer lubricating material for polymer sealing and friction parts of nuclear equipment is provided.

The technical solutions of the present disclosure will be clearly and completely described below in conjunction with the examples of the present disclosure. Obviously, the described examples are only a part of the embodiments of the present disclosure, rather than all the embodiments. Based on the embodiments of the present disclosure, all other embodiments obtained by those of ordinary skill in the art without creative work shall fall within the scope of the present disclosure.

Example 1

(1) High-purity graphite targets (with a purity of 99.99 at.%) as the target material (a target material size of 300×75 mm) was installed on two independent target positions of the JS650 magnetron sputtering system.

(2) A polished polytetrafluoroethylene (PTFE) test block with a surface roughness Ra of 150 nm was placed in anhydrous ethanol and acetone successively, subjected to an ultrasonic cleaning, each for 10 minutes, and dried with nitrogen. The cleaned and dried PTFE test block was placed on a sample stage in a vacuum chamber.

(3) The two-stage exhaust system of the magnetron sputtering system was used, and the vacuum chamber was first pre-vacuumed to a vacuum degree of 10 Pa by using a mechanical pump. The molecular pump was then turn on to vacuum the vacuum chamber to a vacuum degree of $1.3 \times 10^{-3}$ Pa.

(4) A high-purity argon gas (with a purity of 99.999%) was introduced into the vacuum chamber at a flow rate of 40 sccm. The pressure was adjusted to 5.0 Pa through a flapper valve, and a pulse bias of -500 V was applied to the sample stage to perform the first plasma cleaning of the PTFE substrate for 5 min. A high-purity oxygen gas (with a purity 99.99%) was introduced at a flow rate of 20 sccm, and the PTFE substrate was subjected to the second plasma cleaning for 5 min. The introduction of oxygen gas was stopped, and the pressure in the vacuum chamber was adjusted to 0.5 Pa.

(5) A medium-frequency power supply was turn on and the graphite targets were used as the target materials. After the bombarding at a sputtering current of 3.5 A for 30 minutes, the pressure in the vacuum chamber was adjusted to 0.75 Pa through the flapper valve. The sputtering parameters were kept unchanged, and a magnetron sputtering deposition was performed for 150 min. The sample stage was kept rotating at a rotation rate of 8 r/min during the deposition, and the temperature rise during the entire deposition was lower than 130° C. A hydrogen-free carbon film was formed on the surface of the PTFE substrate with a thickness of 1.0 μm. After the deposition, the medium-frequency power supply was turn off, and the sample was placed in the furnace for 2 hours, obtaining a hydrogen-free carbon film polymer lubricating material.

Example 2

(1) High-purity graphite targets as target materials (a target material size of 300×75 mm) were installed on two independent target positions of the JS650 magnetron sputtering system.

(2) A polished polyether ether ketone (PEEK, GEHR, PEEK® grade) test block with a surface roughness Ra of 150 nm was placed in anhydrous ethanol and acetone successively, subjected to an ultrasonic cleaning, each for 15 minutes, and dried with nitrogen. The cleaned and dried PTFE test block was placed on a sample stage in a vacuum chamber.

(3) The two-stage exhaust system of the magnetron sputtering system was used, and the vacuum chamber was first pre-vacuumed to a vacuum degree of 10 Pa by using a mechanical pump. The molecular pump was then turn on to vacuum the vacuum chamber to a vacuum degree of $1.5 \times 10^{-3}$ Pa.

(4) A high-purity argon gas (with a purity of 99.999%) was introduced into the vacuum chamber at a flow rate of 40 sccm. The pressure was adjusted to 6.0 Pa through a flapper valve, and a pulse bias of -500 V was applied to the sample stage to perform the first plasma cleaning of the polyether ether ketone substrate for 5 minutes. A high-purity oxygen (with a purity of 99.99%) was introduced at a flow rate of 30 sccm, and the polyether ether ketone substrate was subjected to a second plasma cleaning for 5 minutes. The introduction of oxygen gas was stopped, and the pressure in the vacuum chamber was adjusted to 0.55 Pa.

(5) A medium-frequency power supply was turn on and the graphite targets were used as the target materials. After the bombarding at a sputtering current of 4.0 A for 30 minutes, the pressure in the vacuum chamber was adjusted to 0.75 Pa through the flapper valve. The deposition parameters were kept unchanged, and a magnetron sputtering deposition was performed for 180 minutes. The sample stage was kept rotating at a rotation rate of 8 r/min during the deposition, and the temperature rise during the entire deposition was lower than 130° C. A hydrogen-free carbon film was formed on the surface of the polyether ether ketone substrate with a thickness of 1.2 μm. After the deposition, the medium-frequency power supply was turn off, and the sample was placed in the furnace for 2 hours, obtaining a hydrogen-free carbon film polymer lubricating material.

Example 3

(1) High-purity graphite targets as target materials (a target material size of 300×75 mm) were installed on two independent target positions of the JS650 magnetron sputtering system.

(2) A polished polytetrafluoroethylene (PTFE) test block with a surface roughness Ra of 150 nm was placed in anhydrous ethanol and acetone successively, and subjected to an ultrasonic cleaning, each for 10 minutes, and dried with nitrogen. The cleaned and dried PTFE test block was placed on a sample stage in a vacuum chamber.

(3) The two-stage exhaust system of the magnetron sputtering system was used, and the vacuum chamber was first pre-vacuumed to a vacuum degree of 10 Pa by using a mechanical pump. The molecular pump was then turn on to vacuum the vacuum chamber to a vacuum degree of $1.0 \times 10^{-3}$ Pa.

(4) A high-purity argon gas (with a purity of 99.999%) was introduced into the vacuum chamber at a flow rate of 40 sccm. The pressure was adjusted to 8.0 Pa through a flapper valve, and a pulse bias of -500 V was applied to the sample stage to perform the first plasma cleaning of the PTFE substrate for 5 minutes. A high-purity oxygen (with a purity of 99.99%) was introduced at a flow rate of 30 sccm, and the PTFE substrate was subjected to a second plasma cleaning for 5 minutes. The introduction of oxygen gas was stopped, and the pressure in the vacuum chamber was adjusted to 0.55 Pa.

(5) A medium-frequency power supply was turn on and the graphite targets were used as the target materials. After the bombarding at a sputtering current of 4.0 A for 30 minutes, the pressure in the vacuum chamber was adjusted to 1.0 Pa through the flapper valve. The deposition parameters were kept unchanged, and a magnetron sputtering deposition was performed for 150 min. The sample stage was kept rotating at a rotation rate of 8 r/min during the deposition, and the temperature rise during the entire deposition was lower than 130° C. A hydrogen-free carbon film was formed on the surface of the PTFE substrate with a thickness of 1.0 μm. After the deposition, the medium-frequency power supply was turn off, and the sample was placed in the furnace for 2 hours, obtaining a hydrogen-free carbon film polymer lubricating material.

Characterization and Testing

Figure 1B:
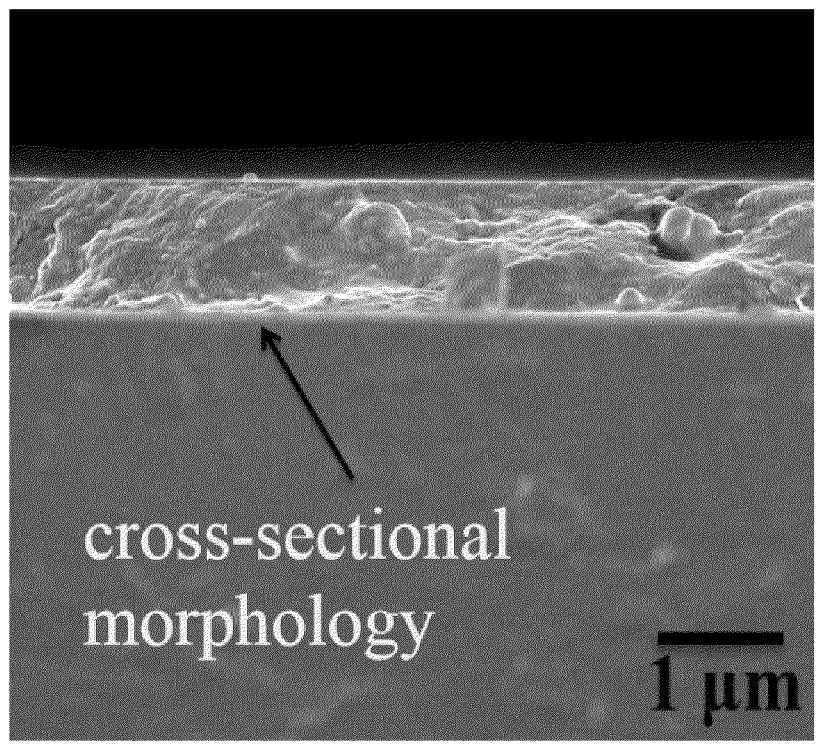

1) The hydrogen-free carbon film as prepared in Example 1 was subjected to a SEM characterization by using JSM-6701F field emission scanning electron microscope (FESEM). The results obtained are shown in FIGS. 1A-1B, in which FIG. 1A shows the surface morphology and FIG. 1B shows the cross-sectional morphology. It can be seen from FIGS. 1A-1B that the film has a relatively compact structure.

Figure 2:
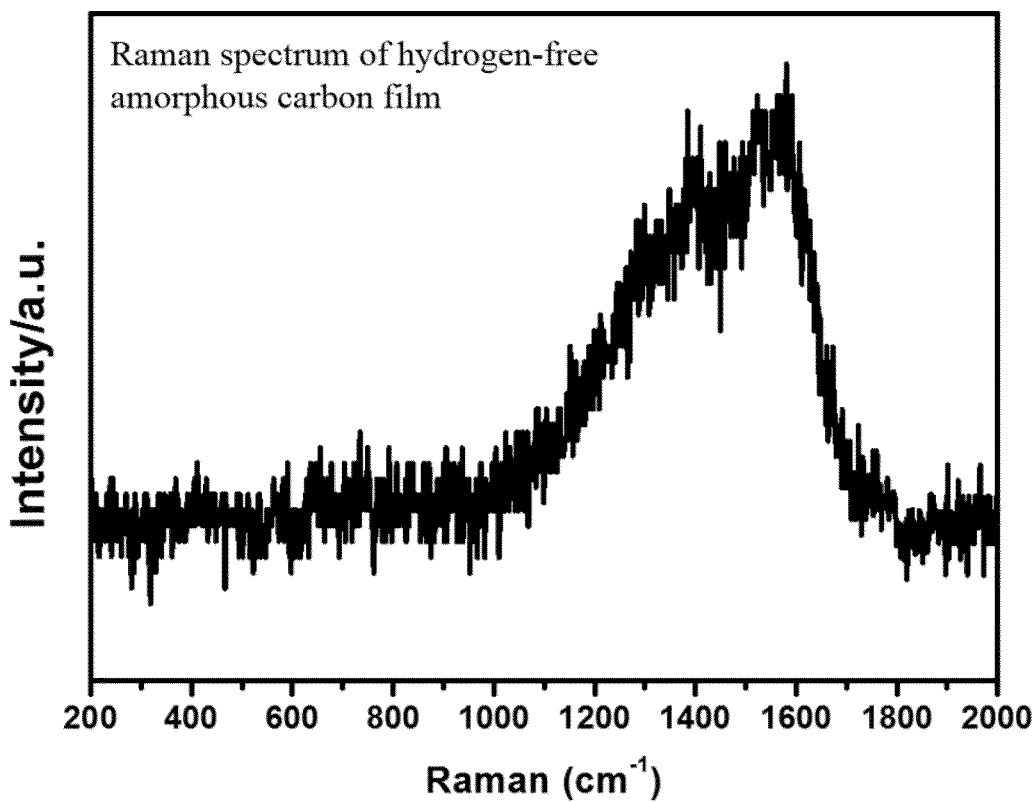
FIG. 2 shows a Raman test diagram of the hydrogen-free carbon film polymer lubricating material as prepared in Example 1.

2) The hydrogen-free carbon film as prepared in Example 1 was subjected to a Raman characterization by using HR800 Raman spectrometer. The results obtained are shown in FIG. 2. The Raman results were processed by Gaussian peak splitting. It shows that the hydrogen-free carbon film has a $I_D/I_G$ of 1.19 : 1, indicating that the prepared carbon film is a carbon-based film with a typical DLC amorphous structure.

Figure 3:
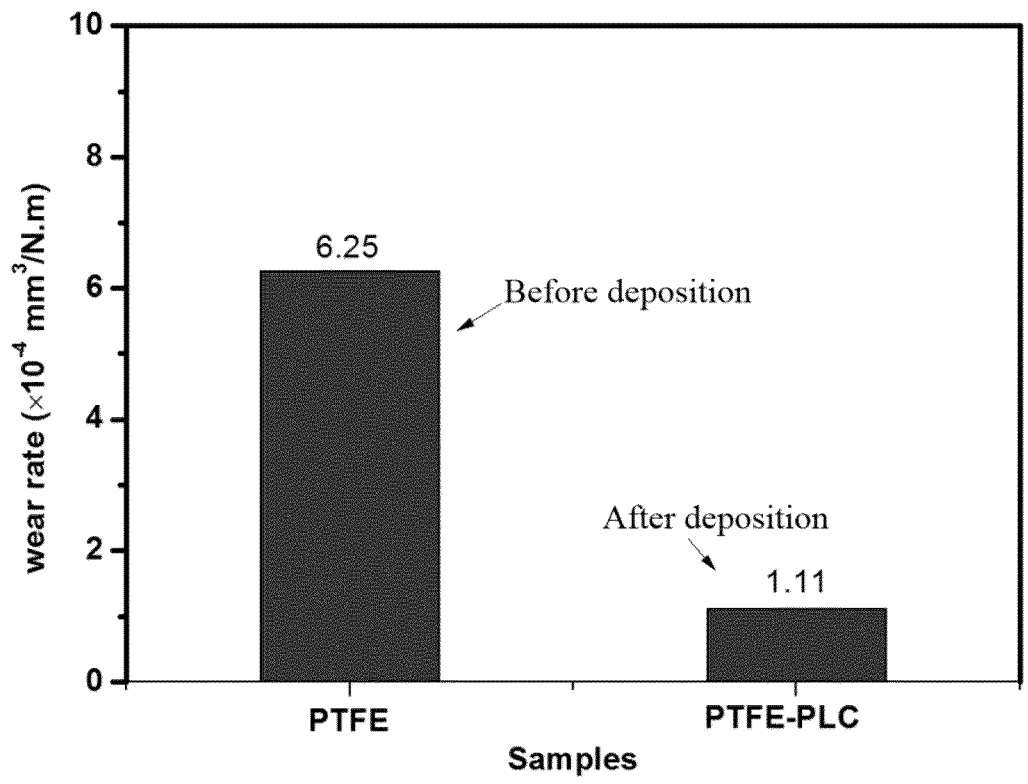
FIG. 3 shows wear rates of polytetrafluoroethylene (PTFE) polymer before and after depositing the hydrogen-free carbon film on its surface in Example 1.

3) The polished polytetrafluoroethylene in step (2) of Example 1 and the prepared hydrogen-free carbon film polymer lubricating material were subjected to friction experiments by using a CSM friction tester, respectively. Conditions for the friction experiments were as follows: GCr15 steel balls having a diameter of 6 mm were used for reciprocated friction test, in which a load of 3 N was applied at a frequency of 3 Hz, 10 min for each time; the cross-sectional area of the wear scar was then measured by using D-300 two-dimensional profiler produced by KLA-Tencor Corporation; the volume wear rate was calculated according to $\omega = V/(N \cdot L)$, where $\omega$ represents the sample wear rate, V represents the wear volume of the sample (in $mm^3$), N represents the normal load (in N), and L represents the sliding distance (in m). The results are shown in FIG. 3. FIG. 3 shows that the polished PTFE without carbon film on its surface exhibits a wear rate of $6.25 \times 10^{-4}$ $mm^3/N.m$, while the non-hydrogen carbon film polymer lubricating material (PTFE-PLC, polytetrafluoroethylene with a non-hydrogen carbon film on its surface) exhibits a wear rate of $1.11 \times 10^{-4}$ mm³/N.m, which is only 17.76% of that before the deposition, indicating that the wear resistance performance of PTFE is significantly improved after depositing a hydrogen-free carbon film on its surface.

Figure 4:
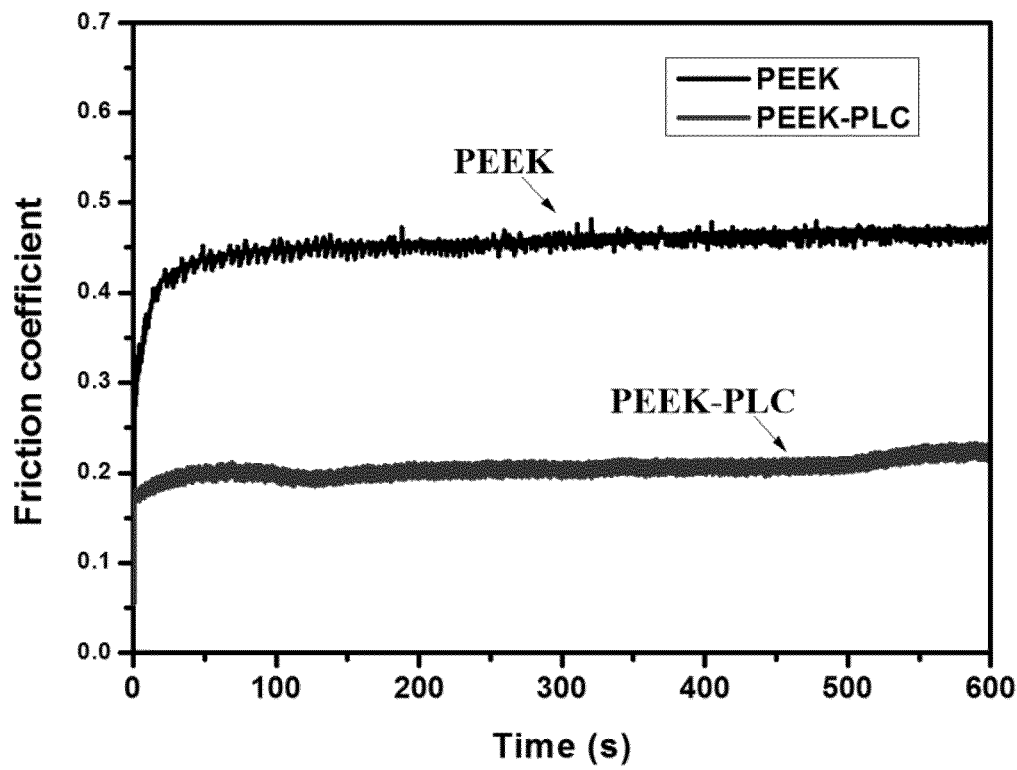
FIG. 4 shows friction coefficients of the PEEK polymer before and after depositing the hydrogen-free carbon film on its surface in Example 2.

4) The polished polyether ether ketone in step (2) of Example 2 and the prepared hydrogen-free carbon film polymer lubricating material (PEEK-PLC, polyether ether ketone with a hydrogen-free carbon film deposited on its surface) were subjected to friction experiments by using a CSM friction tester, respectively. Conditions for the friction experiments were as follows: GCr15 steel ball having a diameter of 6 mm was used for reciprocated friction test, in which a load of 3 N was applied at a frequency of 3 Hz, 10 min for each time. The results are shown in FIG. 4. FIG. 4 shows that the polished polyether ether ketone has a friction coefficient of 0.45, while the polyether ether ketone with a hydrogen-free carbon film on its surface has a friction coefficient of 0.2, indicating that the lubricating performance of the polyether ether ketone is significantly improved after depositing a non-hydrogen carbon film on its surface.

Figure 5:
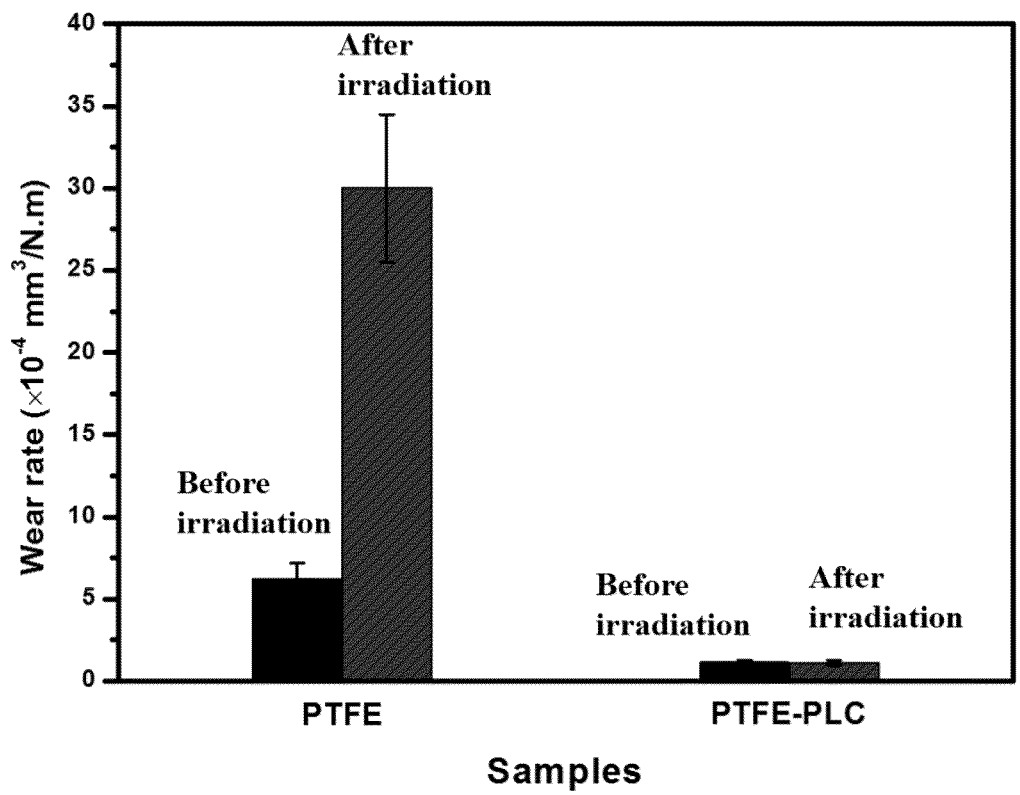
FIG. 5 shows wear rates of the PEEK polymer before and after depositing the hydrogen-free carbon film on its surface and exposing it to 1MGy gamma irradiation in Example 3.

5) The polished polytetrafluoroethylene in step (2) of Example 3 and the prepared polytetrafluoroethylene with a hydrogen-free carbon film deposited on its surface (PTFE-PLC, the hydrogen-free carbon film polymer lubricating material) were exposed to γ irradiation in an irradiation chamber for 200 h, with an irradiation dose rate of 5.0 kGy/h, and a total irradiation dose of 1 MGy, and then subjected to friction experiments by using a CSM friction tester, respectively. The wear rate results are shown in FIG. 5. As can be seen from FIG. 5, the wear rate of the polished PTFE after irradiation is increased to $3.0 \times 10^{-3}$ mm³/N.m from $6.25 \times 10^{-4}$ mm³/N.m (before irradiation), which is increased by an order of magnitude, while the wear rate of PTFE deposited with hydrogen-free carbon film is $1.1 \times 10^{-4}$ mm³/N.m, either before irradiation or after irradiation, which is not changed, indicating that the PTFE deposited with a hydrogen-free carbon film not only exhibits better friction performance than the polished PTFE without surface treatment, but also exhibits excellent resistance irradiation performance.

The above are only the preferred embodiments of the present disclosure. It should be pointed out that for those of ordinary skill in the art, without departing from the principle of the present disclosure, several improvements and modifications could be made, and these improvements and modifications shall also fall within the scope of the present disclosure.

What is claimed is:

1. A method for preparing a hydrogen-free carbon film polymer lubricating material, the method comprising
   providing a graphite target as a sputtering target material;
   performing a magnetron sputtering deposition onto a polymer substrate material to obtain the hydrogen-free carbon film polymer lubricating material; and
   before performing the magnetron sputtering deposition, subjecting the polymer substrate material to a plasma cleaning to obtain a polymer substrate material with active oxygen-containing functional groups on a deposition surface,
   wherein the plasma cleaning comprises a first plasma cleaning and a second plasma cleaning performed in sequence;
   wherein the first plasma cleaning is performed in an argon gas atmosphere under conditions: a flow rate of the argon gas being 20 sccm-40 sccm, a pressure of the argon gas atmosphere being 5.0 Pa-8.0 Pa, a pulse bias voltage for the first plasma cleaning being -500 V, and a first cleaning time being 5 min; and
   wherein the magnetron sputtering deposition is performed at a sputtering current being 3.0 A-4.0 A, first at a gas pressure of 0.5 Pa to 0.6 Pa for 30 min, and then at a gas pressure of 0.75 Pa-1 Pa for 120 min-180 min.

2. The method as claimed in claim 1, wherein the polymer substrate material has a surface roughness Ra of not larger than 400 nm, and the polymer substrate material includes at least one member selected from the group consisting of polytetrafluoroethylene, polyether ether ketone, and polyimide.

3. The method as claimed in claim 1, wherein the second plasma cleaning is performed in a mixed atmosphere of argon gas and oxygen gas under conditions: a flow rate of the argon gas being 20 sccm-40 sccm, a flow rate of the oxygen gas being 20 sccm-40 sccm, a pulse bias voltage for the second plasma cleaning being -500 V, and a second cleaning time being 5 min.

4. The method as claimed in claim 1, wherein the magnetron sputtering deposition is performed in an argon atmosphere, and during the magnetron sputtering deposition, the polymer substrate material is rotated at a rotation rate of 5 r/min-8 r/min.

* * * * *